United States Patent
Kornilov et al.

(10) Patent No.: US 9,685,934 B2
(45) Date of Patent: Jun. 20, 2017

(54) MULTI-BIT FLIP-FLOP WITH SOFT ERROR SUPPRESSION

(71) Applicant: FREESCALE SEMICONDUCTOR, INC., Austin, TX (US)

(72) Inventors: Alexander Ivanovich Kornilov, Moscow (RU); Victor Mikhailovich Mikhailov, Moscow (RU); Mikhail Yurievich Semenov, Moscow (RU); David Russell Tipple, Leander, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/173,175

(22) Filed: Jun. 3, 2016

(65) Prior Publication Data

US 2017/0149419 A1    May 25, 2017

(30) Foreign Application Priority Data

Nov. 23, 2015  (RU) .................... 2015149960

(51) Int. Cl.
| | | |
|---|---|---|
| H03K 3/00 | (2006.01) | |
| H03K 3/037 | (2006.01) | |
| H03K 3/013 | (2006.01) | |

(52) U.S. Cl.
CPC .......... *H03K 3/0375* (2013.01); *H03K 3/013* (2013.01)

(58) Field of Classification Search
None
See application file for complete search history.

(56) References Cited

U.S. PATENT DOCUMENTS

| | | | | |
|---|---|---|---|---|
| 5,457,718 A | * | 10/1995 | Anderson | ............ H03L 7/0814 375/373 |
| 5,789,953 A | * | 8/1998 | Au | ..................... H03K 5/00006 327/113 |
| 7,620,883 B1 | | 11/2009 | Carmichael et al. | |
| 7,772,874 B2 | | 8/2010 | Rezgui et al. | |
| 8,324,951 B1 | | 12/2012 | Zarkesh-Ha et al. | |
| 8,471,597 B2 | * | 6/2013 | Wang | ........................ G06F 1/04 326/46 |
| 8,495,550 B2 | | 7/2013 | Lilja | |
| 8,847,621 B2 | | 9/2014 | Cannon et al. | |
| 9,473,117 B2 | * | 10/2016 | Kim | .................. G01R 31/3177 |
| 2010/0264953 A1 | | 10/2010 | Lilja | |

OTHER PUBLICATIONS

Lee, H., et al., "LEAP: Layout Design through Error-Aware Transistor Positioning for Soft-Error Resilient Sequential Cell Design", 2010 IEEE International Reliability Physics Symposium (IRPS), May 2-6, 2010, pp. 203-212.

* cited by examiner

Primary Examiner — Cassandra Cox

(57) ABSTRACT

A multi-bit flip-flop includes at least two storage stages. Each of the storage stages includes redundant latches to suppress state corruptions resulting from soft error upset at the storage stage. In addition, the multi-bit flip-flop includes a split clock path that routes different shared clock signals that control the timing of the latches. The shared split clock path reduces or eliminates the impact of soft errors on the clock signals, thereby further limiting the impact of such errors on data stored at the flip-flop. In particular, the split clock path can be distributed over disparate cells in a layout of multi-bit flip-flop, thereby reducing the likelihood that a transient charge will cause a soft error in all paths of the split clock path.

21 Claims, 6 Drawing Sheets

MULTI-BIT FLIP-FLOP WITH SOFT ERROR SUPPRESSION

BACKGROUND

Field of the Disclosure

The present disclosure relates generally to flip-flops and more particularly relates to flip-flops with soft error suppression.

Description of the Related Art

Processors and other integrated circuits are often subject to environmental conditions that can cause temporary disruptions in device operation. For example, alpha particles or other high energy particles in the environment of an integrated circuit can change the state of digital information stored at a flip-flop of the integrated circuit from a desired or expected state. This disruption is referred to generally as a soft error, and more specifically as a single error upset (SEU). While an SEU is temporary, in that it will typically not recur if the integrated circuit is reset, it can seriously impact operation of the integrated circuit, at least temporarily. Accordingly, it is often beneficial to employ in the integrated circuit flip-flops that are resistant to SEU.

One example of an SEU resistant flip-flop is one that employs triple voting circuitry, also referred to as triple module redundancy (TMR). A TMR flip-flop stores its bit of data in three separate storage modules. Each module "votes" on the output of the TMR flip-flop, such that the flip-flop outputs the state corresponding to the majority of the data stored at the three storage modules. Thus, the output state is resistant to an SEU at one of the three storage modules. However, because of the three storage modules, a TMR flip-flop requires a relatively large amount of circuit area and consumes a large amount of power.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-8 illustrate techniques for suppressing soft errors at an integrated circuit by employing a multi-bit flip-flop having at least two storage stages. Each of the storage stages includes redundant latches to suppress state corruptions resulting from SEU at the storage stage. In addition, the multi-bit flip-flop includes a split clock path that routes different shared clock signals that control the timing of the latches. The shared split clock path reduces or eliminates the impact of soft errors on the clock signals, thereby further limiting the impact of such errors on data stored at the flip-flop. In particular, the split clock path can be distributed over disparate cells in a layout of multi-bit flip-flop, thereby reducing the likelihood that a transient charge will cause a soft error in all paths of the split clock path.

Further, in at least one embodiment the multi-bit flip-flop includes shared split set and reset signal paths to route shared set and reset signals to the latches. Similar to the split clock path, the shared split set and reset signal paths can be distributed at disparate cells in the layout of the multi-bit flip-flop. This reduces the likelihood that a soft error in one of the split set and reset signal paths will cause an SEU at the multi-bit flip-flop.

Figure 1:
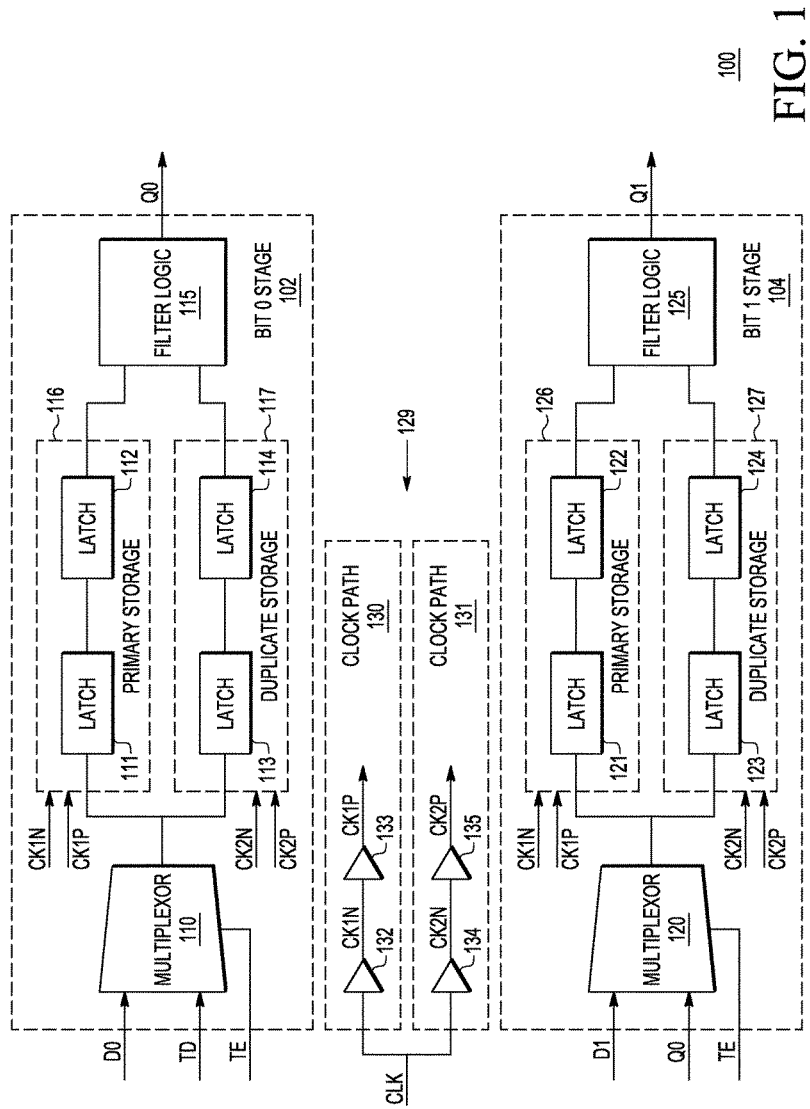
FIG. 1 is a block diagram of a multi-bit flip-flop with soft error suppression and employing a shared clock path in accordance with at least one embodiment.

FIG. 1 illustrates a block diagram of a multi-bit flip-flop 100 in accordance with at least one embodiment. In the illustrated example, the multi-bit flip-flop 100 is configured to store two bits of data independently (so that each of the two stored bits can have a different state). However, it will be appreciated that the techniques described herein can be applied to multi-bit flip-flops storing three or more bits. The multi-bit flip-flop 100 can be incorporated into any of a variety of integrated circuits such as a general purpose or application specific processor, a device controller, a system-on-a-chip (SOC) and the like. Further, an integrated circuit including the multi-bit flip-flop 100 can be incorporated into any of a variety of devices, including a desktop or laptop computer, server, tablet, smartphone, automobile, and the like.

The multi-bit flip-flop 100 includes storage stages 102 and 104, each configured to store an individual digital bit, designated "BIT 0" and "BIT 1", respectively. The storage stage 102 includes a data input labeled "D0", a test input labeled "TD", a test enable input labeled "TE" and a data output labeled "Q0." In addition, the storage stage 102 includes clock inputs to receive complementary clock signals labeled "CK1N" and "CK1P" and complementary clock signals "CK2N" and "CK2P". The storage stage 102 is generally configured to select one of the D0 and TD inputs, based on the state of a test control signal at the TE input. For example, if the test control signal is negated, indicating normal operation, the storage state 102 selects the D0 input. On the other hand, if the test control signal is asserted the storage stage 102 selects the TD input. In response to selected transitions of the clock signals CK1P and CK2P, as well as their complementary signals, the storage stage 102 stores, as its bit of data, the state of a signal at the selected input, and sets the state of an output signal at the output Q0 based on the stored bit. For example, in one embodiment the storage stage 102 stores the bit of data in response to rising edges of the clock signals CK1P and CK2P (and therefore falling edges of the clock signals CK1N and CK2N).

The storage stage 104 includes a data input labeled "D1", a test input connected to the Q0 output of the storage stage 102, a test enable input labeled "TE" and a data output labeled "Q1." In addition, the storage stage 102 includes clock inputs to receive the clock signals CK1N and CK1P and clock inputs to receive the clock signals CK2N and CK2P. The storage stage 104 is generally similarly to the storage stage 102, in that it selects between the D1 and Q0 inputs based on the test enable signal at the TE input, and stores data at the selected input based upon the timing of the clock signals CK1P and CK2P. In at least one embodiment, the test input of the storage stage 104 is connected to an internal test output of the storage stage 102 (not shown) to facilitate testing.

The multi-bit flip-flop 100 is configured to suppress the impact of soft errors on the outputs at Q0 and Q1 both by employing redundant storage modules and by employing a split clock path 129 to generate the clock signals CK1P, CK1N, CK2P, and CK2N. To illustrate with respect to the redundant storage modules, the storage stage 102 includes a multiplexor 110, a primary storage module 116, a duplicate storage module 117, and filter logic 115. The multiplexor 110 includes inputs connected to the D0, TD and TE inputs, and an output. The primary storage module 116 includes latches 111 and 112, with latch 111 having an input connected to the output of the multiplexor 110 and an output, and latch 112 having an input connected to the output of the latch 111 and an output. The duplicate storage module 117 includes latches 113 and 114, with latch 113 having an input connected to the output of the multiplexor 110 and an output, and latch 114 having an input connected to the output of the latch 113 and an output. The filter logic 115 includes an input connected to the output of the latch 112, an input connected to the output of the latch 114, and an output connected to the Q0 output.

The multiplexor 110 is configured to select one of the D0 and TD inputs based on the state of the test enable signal at the TE input, and provide a signal at the selected input at its output. The latches 111, 112, 113, and 114 are latches composed of one or more feedback loops, such as sets of cross-coupled inverters, to store data at their respective inputs based on the timing of the clock signals CK1P, CK1N, CK2P, and CK2N. In one embodiment, the latch 111 and latch 112 are each controlled by different edges of the respective clock signals, as is understood by those skilled in the art, and the latches 113 and 114 are controlled similarly. Accordingly, when there are no soft errors (or other errors) on the signal paths of the storage stage 102, the primary storage module 116 and the duplicate storage module 117 both store the data selected at the multiplexor 110.

The filter logic 115 is logic configured to sets a stage of an output signal at the output Q0 based on whether the outputs of the primary storage module 116 and the duplicate storage module 117 match. In particular, when the outputs match, the filter logic 115 sets the state of the output signal to the matching state. Thus, for example, if both the output of the primary storage module 116 and the output of the storage module 117 are in an asserted state, the filter logic 115 generates the output signal to also have an asserted state.

A mismatch between the outputs of the primary storage module 116 and the duplicate storage module 117 indicates a soft error has occurred at the storage stage 102. Accordingly, in response to a mismatch between the outputs of the primary storage module 116 and the duplicate storage module 117, the filter logic 115 maintains the state of the output signal at the output Q0 at its previous state—that is, the state that was set when the outputs of the primary storage module 116 and the duplicate storage module 117 last matched. Thus, for example, when the output of the primary storage module 116 and the output of the duplicate storage module 117 are in an asserted state, the filter logic 115 generates the output signal to also have an asserted state. If the output of the primary storage module 116 changes to a negated state while the output of the duplicate storage module 117 is maintained in an asserted state, a potential soft error at the primary storage module 116 is indicated. Accordingly, the filter logic 115 maintains the state of the output signal at the output Q0 in the asserted state, thereby suppressing the soft error.

The storage stage 104 is similarly configured to the storage stage 102 to suppress soft errors for BIT 1. In particular, the storage stage 104 includes a multiplexor 120, a primary storage module 126 (including latches 121 and 122, a duplicate storage module 127 (including latches 123 and 124), and filter logic 125, connected similarly to the corresponding modules of the storage stage 102. Further, the modules of the storage stage 104 are configured to store data and suppress soft errors in similar fashion to that described above with respect to the storage stage 102.

In addition to impacting the signal lines of the storage stages 102 and 104 that carry the stored bits of data, soft errors can impact the signal lines that carry the clock signals CK1N, CK1P, CK2N, and CK2P. Such soft errors can cause errors in the timing of one or more of the latches of the storage modules 116, 117, 126, and 127. To suppress such errors, the multi-bit flip-flop 100 employs a split clock path 129 including a clock path 130 and a clock path 131. Each of the clock paths 130 and 131 generate clock signals based on a common clock signal, labeled "CLK." In particular, the clock path 130 includes an inverter 132 having an input to receive the CLK signal and an output to provide the clock signal CK1N. In addition, the clock path 130 includes an inverter 133 having an input connected to the output of the inverter 132 and an output to provide the clock signal CK1P. The clock path 131 includes an inverter 134 having an input to receive the CLK signal and an output to provide the clock signal CK2N. The clock path 131 also includes an inverter 135 having an input connected to the output of the inverter 134 and an output to provide the clock signal CK2P.

In at least one embodiment, the inverters 132-135 are all sized similarly, such that they have a similar effect on the timing of their respective input clock signals. Accordingly, in the absence of soft errors, the timing of the clock signal CK1N is substantially the same as the timing of the clock signal CK2N, and the timing of the clock signal CK1P is substantially the same as the timing of the clock signal CK2P. This ensures that the duplicate storage modules 117 and 127 operate similarly, and store the same data as, the corresponding primary storage modules 116 and 126, in the absence of soft errors. Further, and as described further below with respect to FIG. 2, the separate clock paths 130 and 131 can be arranged in a layout of the integrated circuit so that a soft error on one of the clock paths is unlikely to affect the other. Therefore, because the timing for the primary storage modules and duplicate storage modules, respectively, are controlled by different clock paths, a soft error on one of the split clock paths will not cause an error at the storage module controlled by the other split clock path. Thus, for example, a soft error on clock path 130 will affect the timing at the primary storage modules 116 and 126, but not at the duplicate storage modules 117 and 127. Accordingly, the soft error on clock path 130 may cause incorrect data to be stored at the primary storage modules 116 and 126, but not at the duplicate storage modules 117 and 127. The error in the stored data will therefore be suppressed by the filter logic 115 and the filter logic 125, as described above. Thus, by employing the shared split clock path 129, the multi-bit flip-flop 100 suppresses the impact of soft errors in the clock signals that control flip-flop timing.

Figure 2:
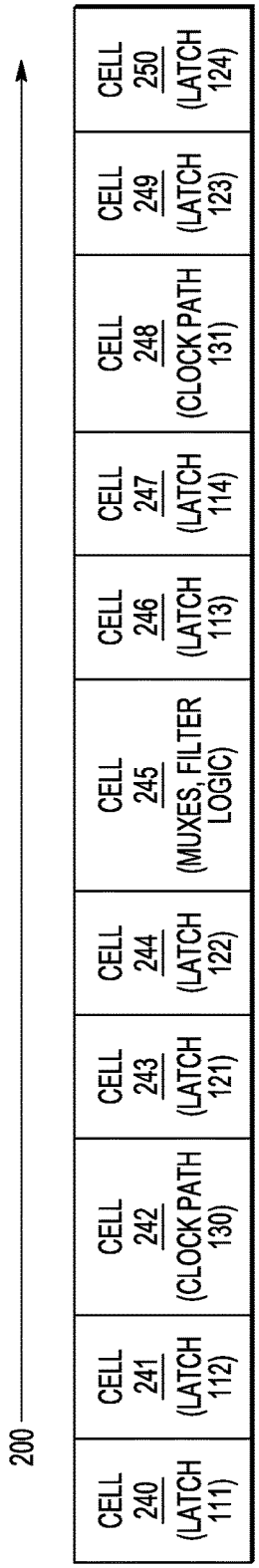
FIG. 2 is a block diagram illustrating a layout of the multi-bit flip-flop of FIG. 1 in accordance with at least one embodiment.

As indicated above, in at least one embodiment the shared split clock path 129 suppresses the impact of soft errors because the individual clock paths 130 and 131 are distributed in disparate portions of a layout of the flip-flop 100. An example of such a layout is illustrated at FIG. 2 in accordance with one embodiment. In particular, FIG. 2 depicts cells 240-250 laid out along a row 200. Each of the cells corresponds to one or more modules of the flip-flop 100, and includes the signal paths, logic gates, and other circuitry of the corresponding module(s). Thus, in the illustrated example, cell 240 corresponds to the circuitry of the latch 111, cell 241 corresponds to the circuitry of the latch 112, cell 242 corresponds to the circuitry of the clock path 130, cell 243 corresponds to the circuitry of the latch 121, cell 244 corresponds to the circuitry of the latch 122, cell 245 corresponds to the circuitry of the multiplexors 110 and 120 and the filter logic 115 and 125, cell 246 corresponds to the circuitry of the latch 113, cell 247 corresponds to the circuitry of the latch 114, cell 248 corresponds to the circuitry of the clock path 131, cell 249 corresponds to the circuitry of the latch 123, and cell 250 corresponds to the circuitry of the latch 124.

In at least one embodiment, each of the cells 240-250 corresponds to a cell selected from a cell library during design and manufacture of an integrated circuit device. During a layout stage of the design and manufacture of the integrated circuit device, an automated layout tool places the selected cells based on a design file for the integrated circuit, and routes connections between the cells. During a manufacturing stage, a manufacturing tool places the circuitry for each cell along the row 200 based on the layout, thereby forming the flip-flop 100 at the integrated circuit. In another embodiment the multibit flip-flop 100 and its layout can be implemented as a one-row or multi-row standard cell and be a part of standard cell library. During a layout stage of the design and manufacture of the integrated circuit device, an automated layout tool places the flip-flop 100 with other standard cells from a cell library based on a design file for the integrated circuit, and routes connections between the cells. During a manufacturing stage, a manufacturing tool places the circuitry for each cell along the row 200 based on the layout, thereby forming the flip-flop 100 at the integrated circuit.

In the illustrated example, the cells 242 and 248, corresponding to the clock paths 130 and 131, respectively, are placed between the cells corresponding to the latches to which each clock path is connected. Thus, cell 242 is placed between cells 240 and 241 and cells 243 and 244 and cell 248 is placed between cells 246 and 247 and cells 249 and 250. This allows the clock paths 130 and 131 to be connected to their respective latches easily and efficiently. Further, cells 243-247 are placed between the cells 242 and 248, so that the clock paths 130 and 131 are placed at disparate locations of the integrated circuit with some distance between them. This ensures that if an alpha particle or other energy source deposits a charge at or near one of the clock paths, the other clock path is sufficiently remote that it will not be affected. Thus, any soft error that occurs is likely to occur at only one of the clock paths 130 and 131, allowing the flip-flop 100 to suppress the soft error as described above.

Figure 3:
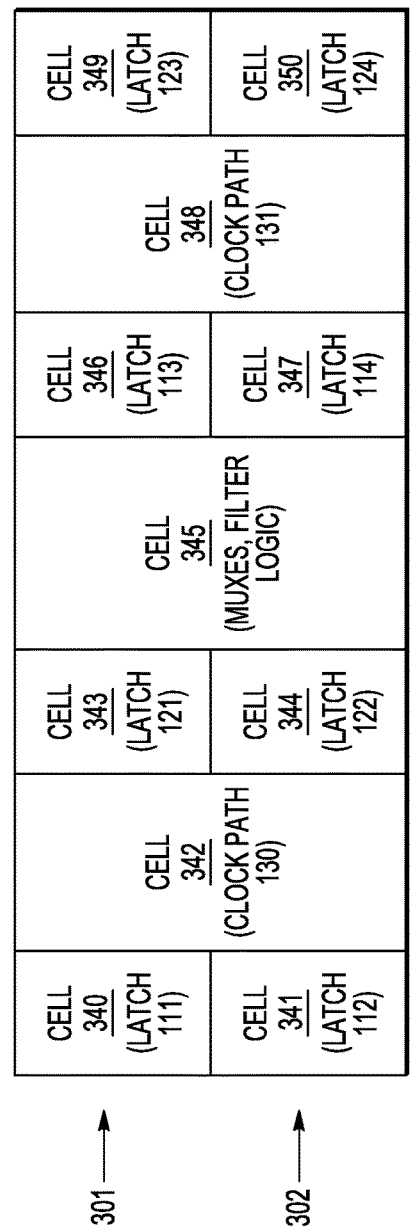
FIG. 3 is a block diagram illustrating a multi-row layout of the flip-flop of FIG. 1 in accordance with at least one embodiment.

FIG. 3 illustrates another layout of cells that supports suppression of soft errors in accordance with at least one embodiment. In particular, FIG. 3 illustrates cells 340-350 laid out in two rows 301 and 302, with row 301 including cells 340, 343, 346, and 349, and row 302 including cells 341, 344, 347, and 350. In addition, in the embodiment of FIG. 3 the cells 342, 345, and 348 are placed across both row 301 and row 302. Similar to FIG. 2, each of the cells 340-350 corresponds to one or more modules of the flip-flop 100. In the illustrated example, cell 340 corresponds to the circuitry of the latch 111, cell 341 corresponds to the circuitry of the latch 112, cell 342 corresponds to the circuitry of the clock path 130, cell 343 corresponds to the circuitry of the latch 121, cell 344 corresponds to the circuitry of the latch 122, cell 345 corresponds to the circuitry of the multiplexors 110 and 120 and the filter logic 115 and 125, cell 346 corresponds to the circuitry of the latch 113, cell 347 corresponds to the circuitry of the latch 114, cell 348 corresponds to the circuitry of the clock path 131, cell 349 corresponds to the circuitry of the latch 123, and cell 350 corresponds to the circuitry of the latch 124.

Similar to FIG. 2, the cells 342 and 348 corresponding to the clock paths 130 and 131, respectively, are placed between the cells corresponding to the latches to which each clock path is connected. Thus, cell 342 is placed between cells 340 and 341 and cells 343 and 344 and cell 348 is placed between cells 346 and 347 and cells 349 and 350. This allows the clock paths 130 and 131 to be connected to their respective latches easily and efficiently. In addition, cells 343-347 are placed between the cells 342 and 348, so that the clock paths 130 and 131 are placed at distant locations of the integrated circuit relative to each other, thereby reducing the likelihood that a transient energy source will cause a soft error at both of the clock paths 130 and 131.

Figure 4:
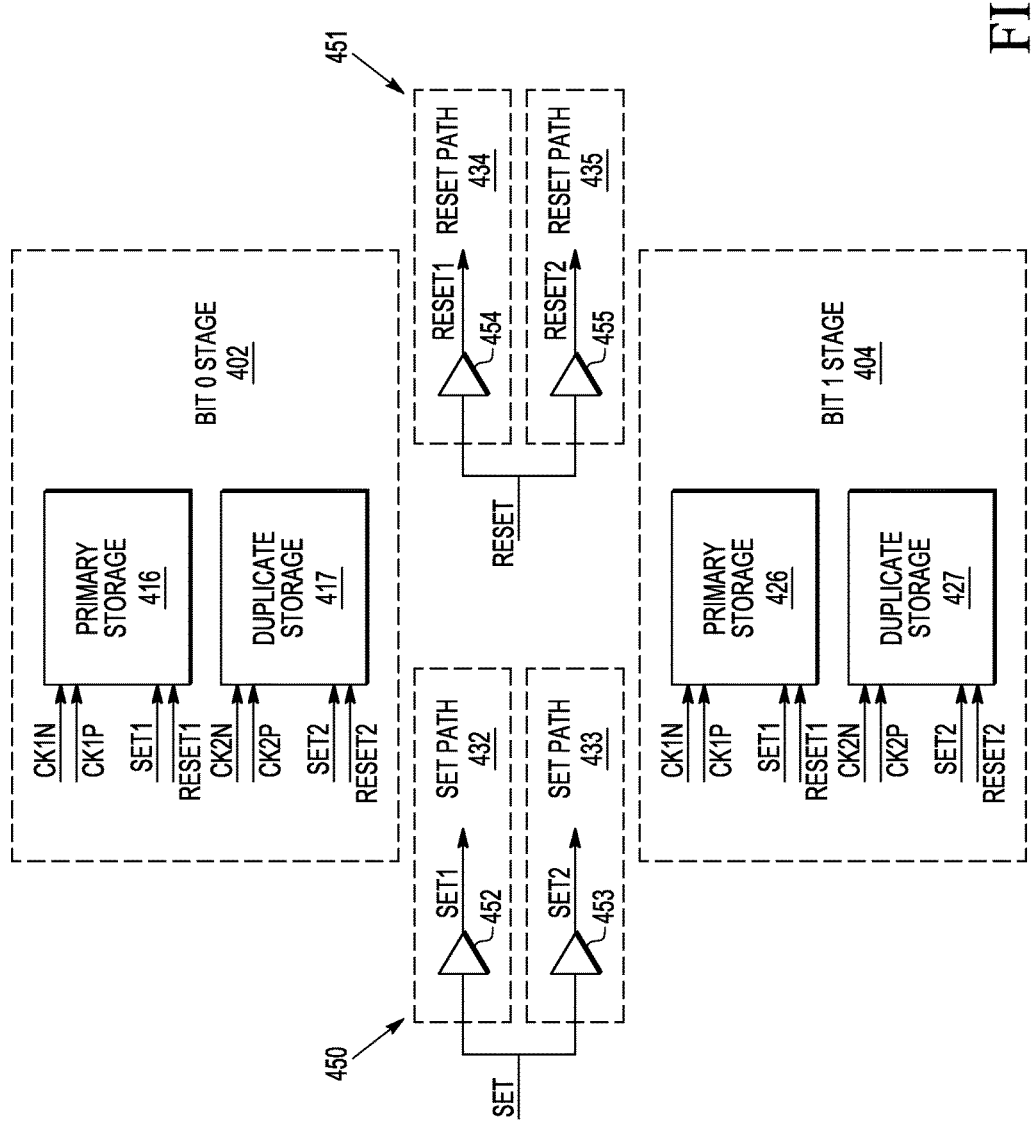
FIG. 4 is a block diagram of a multi-bit flip-flop with soft error suppression, employing shared set and reset control paths in accordance with at least one embodiment.

FIG. 4 illustrates a block diagram of a multi-bit flip-flop 400 in accordance with at least one embodiment. The multi-bit flip-flop 400 is similar to the flip-flop 100 of FIG. 1, but is also configured to set and reset individual the stored bits based on set and reset control signals, designated "SET1", "SET2", "RESET1", and "RESET2" at FIG. 4. Similar to the clock path 129 of FIG. 1, the set and reset control signals are generated by split set path 450 and split reset path 451 respectively. This allows the paths for the set and reset control signals to be shared and located in different sections of the integrated circuit, so that a soft error affecting one of the control signals does not impact the data output by the flip-flop 400.

To illustrate in additional detail, the flip-flop 400 includes storage stage 402, having primary storage module 416 and duplicate storage modules 417, and storage stage 404, having primary storage modules 427 and 428. The storage stages 402 and 404 are generally configured similarly to the storage stages 102 and 104 of FIG. 1, but in addition to receiving the clock signals CK1N, CK1P, CK2N, and CK2P, receives the set and reset control signals. In particular, the primary storage modules 416 and 426 each receive the signals SET1 and RESET1, and the duplicate storage modules 417 and 427 each receive the signals SET2 and RESET2. The primary storage modules 416 and 426 and duplicate storage modules 417 and 427 are each configured to set their stored bit to an asserted state in response to assertion of their respective SET signal and reset their stored bit to a negated state in response to assertion of the respective RESET signal. Thus, for example, assertion of the SET1 signal causes the primary storage modules 416 and 426 to set their stored bit to an asserted state, and assertion of the RESET2 signal causes the duplicate storage modules 417 and 427 to reset their stored bits to a negated state.

The set and reset control signals are generated by split set path 450 and split reset path 451 respectively. The split set path 450 includes set path 432 and set path 433. The set path 432 includes a buffer 452 having an input to receive a set control signal designated "SET" and an output to provide the signal SET1. The set path 433 includes a buffer 453 having an input to receive the signal SET and an output to provide the signal SET2. The split reset path 450 includes reset path 434 and reset path 435. The reset path 434 includes a buffer 454 having an input to receive a set control signal designated "RESET" and an output to provide the signal RESET1. The reset path 435 includes a buffer 455 having an input to receive the signal RESET and an output to provide the signal RESET2.

In at least one embodiment, the buffers 452-455 are all sized similarly, such that they have a similar effect on the timing of their respective input set and reset signals. Accordingly, in the absence of soft errors, the SET1 signal is substantially the same as the SET2 signal and the RESET1 signal is substantially the same as the RESET2 signal. This ensures that set and reset operations are controlled similarly at the primary storage module 416 and the duplicate storage module 417, and that set and reset operations are controlled similarly at the primary storage module 426 and the duplicate storage module 427, in the absence of soft errors. Further, similar to the clock paths 130 and 131 described above with respect to FIG. 1, the separate set paths 432 and 433 and separate reset paths 434 and 435 can be arranged in a layout of the integrated circuit so that a soft error on one of the set paths or one of the reset paths is unlikely to affect the other set or reset path, respectively. Therefore, because the set and reset of the storage modules are controlled by different clock paths, a soft error on one of the split set or reset paths will not cause an error at the storage module controlled by the other set or reset path.

Figure 5:
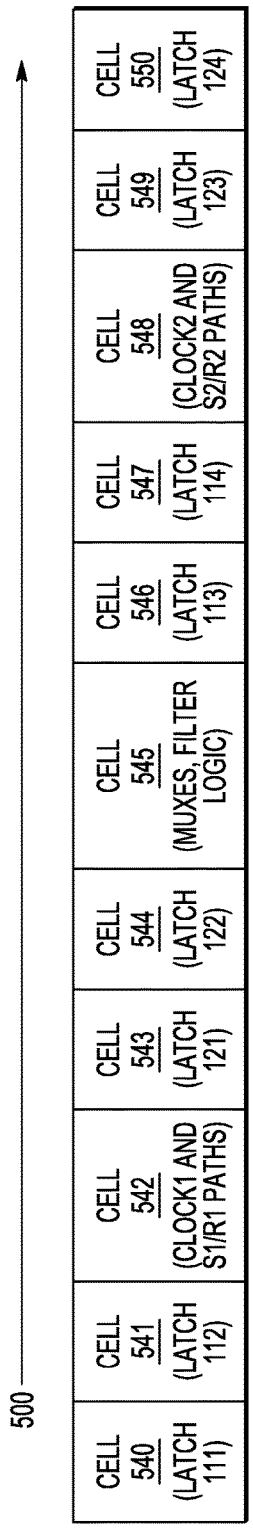
FIG. 5 is a block diagram illustrating a layout of the multi-bit flip-flop of FIG. 4 in accordance with at least one embodiment.

The split set path 450 and split reset path 451 can be shared and distributed to different cells in order to separate the different individual paths, in similar fashion to the clock paths 130 and 131 described above. An example is illustrated at FIG. 5 in accordance with one embodiment. FIG. 5 depicts cells 540-550 laid out along a row 500. Each of the cells corresponds to one or more modules of the flip-flop 400. In the illustrated example, cell 540 corresponds to the circuitry of the latch 111, cell 541 corresponds to the circuitry of the latch 112, cell 542 corresponds to the circuitry of the clock path 130, the set path 432, and the reset path 433, cell 543 corresponds to the circuitry of the latch 121, cell 544 corresponds to the circuitry of the latch 122, cell 545 corresponds to the circuitry of the multiplexors 110 and 120 and the filter logic 115 and 125, cell 546 corresponds to the circuitry of the latch 113, cell 547 corresponds to the circuitry of the latch 114, cell 548 corresponds to the circuitry of the clock path 131, the set path 433, and the reset path 435, cell 549 corresponds to the circuitry of the latch 123, and cell 550 corresponds to the circuitry of the latch 124.

In the illustrated example, the cells 542 and 548, corresponding to the different clock paths, set paths, and reset paths are placed between the cells corresponding to the latches to which each clock path is connected. Thus, cell 542 is placed between cells 540 and 541 and cells 543 and 544 and cell 548 is placed between cells 546 and 547 and cells 549 and 550. Further, cells 543-547 are placed between the cells 542 and 548, so that the clock paths, set paths, and reset paths for the primary storage modules and the duplicate storage modules are placed at disparate locations of the integrated circuit with some distance between them, thereby ensuring that if an alpha particle or other energy source deposits a charge at or near one of the clock paths, the other clock path is sufficiently remote that it will not be affected.

Figure 6:
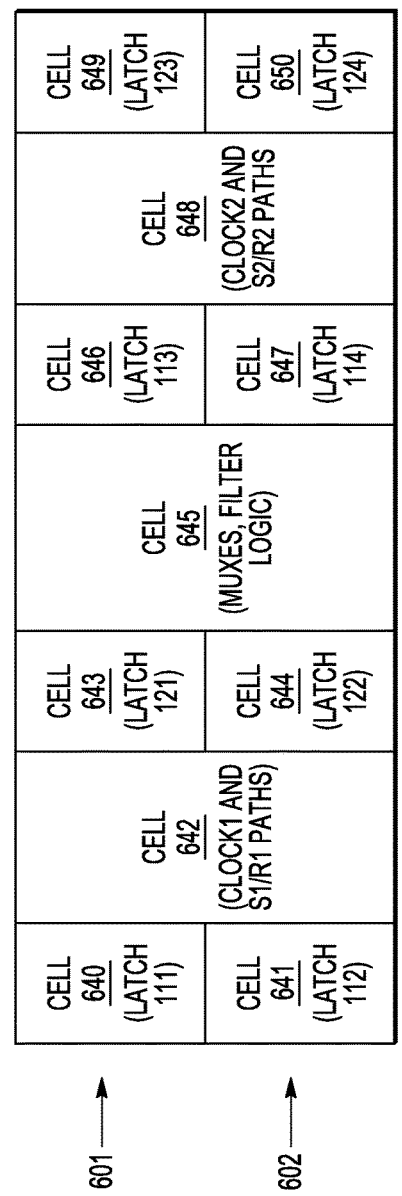
FIG. 6 is a block diagram illustrating a multi-row layout of the flip-flop of FIG. 4 in accordance with at least one embodiment.

FIG. 6 illustrates another layout of cells that supports suppression of soft errors in accordance with at least one embodiment. In particular, FIG. 6 illustrates cells 640-650 laid out in two rows 601 and 602, with row 601 including cells 640, 643, 646, and 649, and row 602 including cells 641, 644, 647, and 650. In addition, cells 642, 645, and 648 are the cells that are placed across both row 601 and row 602. Each of the cells 640-650 corresponds to one or more modules of the flip-flop 400. In the illustrated example, cell 640 corresponds to the circuitry of the latch 111, cell 641 corresponds to the circuitry of the latch 112, cell 642 corresponds to the circuitry of the clock path 130, the set path 432, and the reset path 434, cell 643 corresponds to the circuitry of the latch 121, cell 644 corresponds to the circuitry of the latch 122, cell 645 corresponds to the circuitry of the multiplexors 110 and 120 and the filter logic 115 and 125, cell 646 corresponds to the circuitry of the latch 113, cell 647 corresponds to the circuitry of the latch 114, cell 648 corresponds to the circuitry of the clock path 131, the set path 433, and the reset path 435, cell 649 corresponds to the circuitry of the latch 123, and cell 650 corresponds to the circuitry of the latch 124.

Similar to FIG. 5, the cells 642 and 648 corresponding to the clock paths 130 and 131, respectively, are placed between the cells corresponding to the latches to which each clock path is connected. Thus, cell 642 is placed between cells 640 and 641 and cells 643 and 644 and cell 648 is placed between cells 646 and 647 and cells 649 and 650. This allows the clock paths 130 and 131 to be connected to their respective latches easily and efficiently. In addition, cells 643-647 are placed between the cells 642 and 648, so that the clock paths, set paths, and reset paths for the primary storage modules and duplicate storage modules are placed at distant locations of the integrated circuit relative to each other, thereby reducing the likelihood that a transient energy source will cause a soft error at both of the respective clock paths, set paths, or reset paths.

Figure 7:
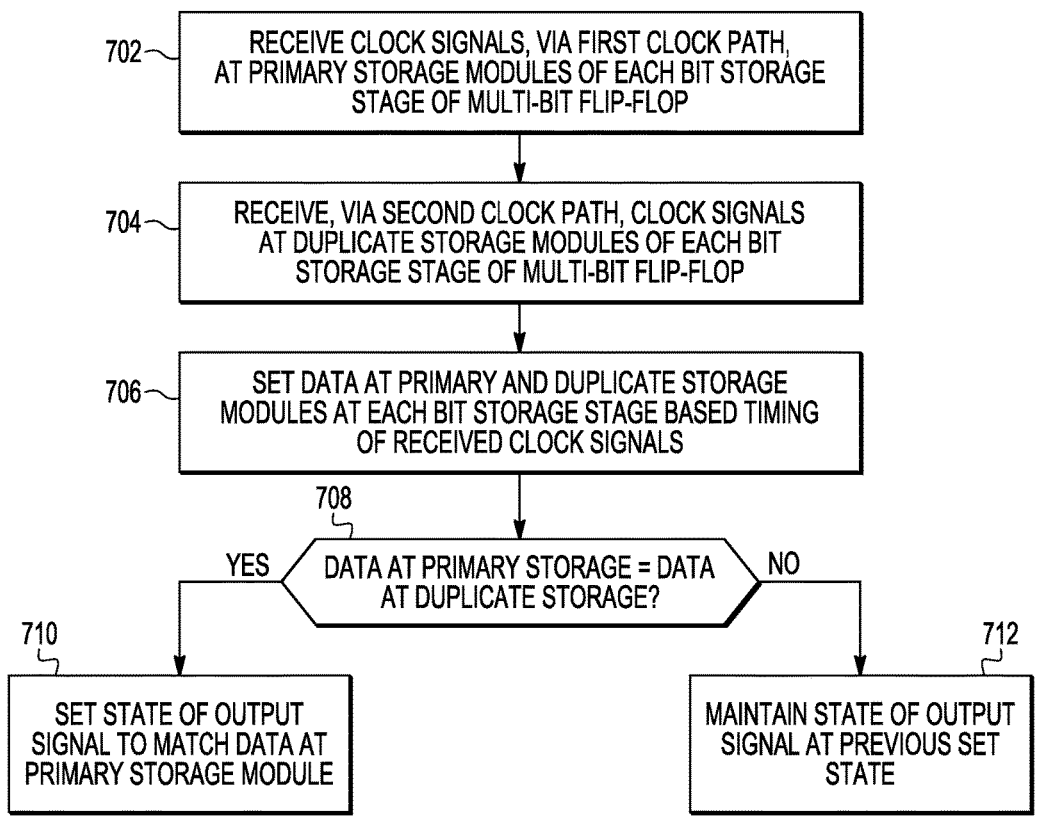
FIG. 7 is a flow diagram of a method of suppressing soft errors at a multi-bit flip-flop in accordance with at least one embodiment.

FIG. 7 illustrates a flow diagram of a method 700 of suppressing soft errors at a multi-bit flip-flop in accordance with at least one embodiment. For purposes of description, the method 700 is described with respect to an example implementation at the multi-bit flip-flop 100 of FIG. 1. At block 702, the primary storage modules of each storage stage (primary storage modules 116 and 126) receive clock signals via clock path 130. At block 704, the duplicate storage module of each storage stage (duplicate storage modules 117 and 127) receive clock signals via clock path 131. At block 706, the primary storage modules and duplicate storage modules store data at their respective inputs based on the timing of their respective clock signals. As described above, in the absence of soft errors, each duplicate storage module stores the same bit of data at substantially the same time as its corresponding primary storage module. A soft error may impact either a duplicate storage module or a primary storage module, or one of the respective clock paths, but is unlikely to impact both the primary storage module and duplicate storage module and both clock paths. Thus, a soft error is likely to cause incorrect data to be stored at one of the primary storage module and the duplicate storage module of a storage stage, but not both.

At block 708, the filter logic for each storage stage (e.g., filter logic 115 and 125) identifies whether the outputs of the corresponding primary storage module and duplicate storage module match. If so, the method flow moves to block 710 and the filter logic sets the state of the output signal for the storage stage to the same state as the output of the primary storage module. Returning to block 708, if the filter logic identifies that the outputs of the corresponding primary storage module and duplicate storage module do not match, a soft error is indicated. Accordingly, the method flow moves to block 712 and the filter logic maintains the state of the output signal for the storage stage at its previous state, thereby suppressing the soft error.

Figure 8:
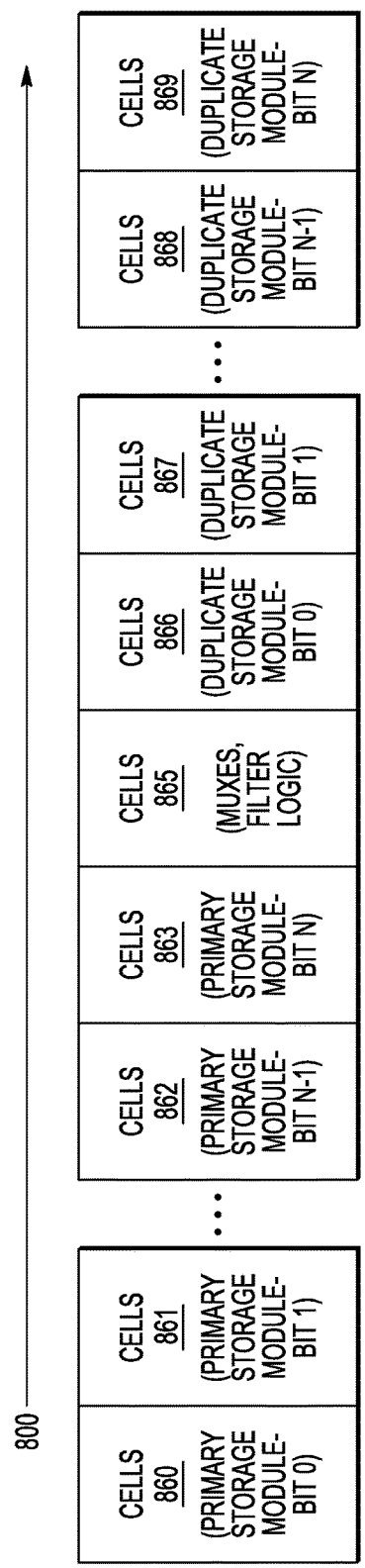
FIG. 8 is a block diagram illustrating a layout of an N-bit multi-bit flip-flop in accordance with at least one embodiment.

FIGS. 1-6 have been described with respect to an example embodiment of a multi-bit flip-flop that stores two different bits. However, the techniques described herein are applicable to multi-bit flip-flops storing N different bits, where N is an integer greater than 1. An example layout of an N-bit multi-bit flip-flop is illustrated at FIG. 8 according to one embodiment. In the depicted example, the N-bit multi-bit flip-flop includes sets of cells 860-869 arranged in a layout along a row 800. The cells 860-869, when connected, form a multi-bit flip-flop similar to the multi-bit flip-flop of FIG. 1, but having N storage stages, each to store a different one of N bits, where N is an integer greater than 2. Each storage stage includes a corresponding primary storage module and duplicate storage module. In the example of FIG. 8, the set of cells 860 includes the circuitry for the primary storage module of BIT 0, the set of cells 861 is adjacent to the set of cells 860 and includes the circuitry for the primary storage module of BIT 1, and additional cell sets including the circuitry of corresponding primary storage modules are arranged adjacently along the row 800, with the set of cells 862 including the circuitry for the primary storage module of BIT N−1 and the adjacent set of cells 863 including the circuitry for the primary storage module of BIT N.

Adjacent to the set of cells 863 is a set of cells 865 including circuitry of the filters and multiplexors for each of the storage stages of BITs 0-N. After the set of cells 865, on the other side of the sets of cells 860-863 and therefore distant from them, are arranged the sets of cells 866-869, including circuitry for corresponding duplicate storage modules for BITs 0-N. Thus, in the depicted example, set of cells 866 includes the circuitry for the duplicate storage module of BIT 0, the set of cells 867 is adjacent to the set of cells 866 and includes the circuitry for the duplicate storage module of BIT 1, and additional cell sets including the circuitry of corresponding duplicate storage modules are arranged adjacently along the row 800, with the set of cells 868 including the circuitry for the primary storage module of BIT N−1 and the adjacent set of cells 869 including the circuitry for the primary storage module of BIT N.

In the embodiment of FIG. 8, the layout of the N-bit multi-bit flip flop is such that at least N sets of cells are disposed between the set of cells including the circuitry of the primary storage module for a given bit and the set of cells including the circuitry of the duplicate storage module for the given bit. This distance reduces the likelihood that an energetic particle strike that causes a soft error at one of the storage modules for the given bit will cause a soft error at the other storage module for the given bit. This allows the multi-bit flip flop to employ the filter logic to suppress the soft error as described above. Further, as the number of bits in the multi-bit flip-flop is increased, the distance between corresponding storage modules is also increased, so that multi-bit flip-flops storing more bits are correspondingly more resistant to soft errors.

In at least one embodiment, the N-bit multi-bit flip-flop of FIG. 8 can include shared split clock paths an as described above with respect to FIG. 1. The cells for each clock path of the shared split clock paths can be placed anywhere along row 800 near the sets of cells to which the clock path is connected. Thus, for example, the cells for the clock path that provides clock signals to the primary storage modules of the flip-flop can be placed to the left of the set of cells 860, between any two of the sets of cells to the left of set of cells 865, or between the set of cells 863 and the set of cells 865. The cells for the clock path that provides clock signals to the duplicate storage modules of the flip-flop can be placed at a corresponding position to the right of the set of cells 865. In at least one embodiment, the cells for each clock path can also include corresponding paths of a shared split set-reset path as described above with respect to FIG. 4.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A multi-bit flip-flop comprising:
   a first storage module configured to store a first bit, the first storage module comprising:
   a first primary storage module configured to store the first bit; and
   a first duplicate storage module configured to store a copy of the first bit;
   a second storage module configured to store a second bit, the second storage module comprising:
   a second primary storage module configured to store the second bit; and
   a second duplicate storage module configured to store a copy of the first bit; and
   a shared clock path to provide a first clock signal to the first storage module and the second storage module and second clock signal to the first storage module and the second storage module;
   wherein the first storage module further comprises first filter logic coupled to a first output of the first primary storage module and to a second output of the first duplicate storage module, the first filter logic configured to determine when the first output and the second output are the same.

2. The multi-bit flip-flop of claim 1, wherein the first filter logic configured to generate a third output to match a current state of the first output when the first output and the second output are the same, and to generate the third output to maintain a previous state when the first output and the second output are different.

3. The multi-bit flip-flop of claim 2, wherein the second storage module comprises:
second filter logic coupled to a fourth output of the second primary storage module and to a fifth output of the second duplicate storage module, the second filter logic configured to generate a sixth output to match a current state of the fourth output when the fourth output and the fifth output are the same, and to generate the sixth output to maintain a previous state when the fourth output and the fifth output are different.

4. The multi-bit flip-flop of claim 2, further comprising:
a row of cells including:
a first set of cells including circuitry of the first primary storage module;
a second set of cells including circuitry of the second primary storage module;
a third set of cells comprising a first clock path of the shared clock path, the third set of cells between the first set of cells and the second set of cells in the row;
a fourth set of cells including circuitry of the first duplicate storage module;
a fifth set of cells including circuitry of the second duplicate storage module; and
a sixth set of cells comprising a second clock path of the shared clock path, the sixth set of cells between the first set of cells and the second set of cells, and the fourth set of cells between the second set of cells and the sixth set of cells in the row.

5. The multi-bit flip-flop of claim 4, further comprising:
a seventh set of cells including circuitry of the first filter logic, the seventh set of cells between the third set of cells and the fourth set of cells in the row.

6. The multi-bit flip-flop of claim 2, wherein:
the first primary storage module comprises a first latch and a second latch;
the first duplicate storage module comprises a third latch and a fourth latch;
the second primary storage module comprises a fifth latch and a sixth latch; and
the second duplicate storage module comprises a seventh latch and an eighth latch.

7. The multi-bit flip-flop of claim 6, further comprising:
a first row of cells including:
a first set of cells including circuitry of the first latch;
a second set of cells including circuitry of the third latch;
a third set of cells including circuitry of the fifth latch;
a fourth set of cells including circuitry of the seventh latch;
a second row of cells including:
a fifth set of cells including circuitry of the second latch;
a sixth set of cells including circuitry of the fourth latch;
a seventh set of cells including circuitry of the sixth latch;
an eighth set of cells including circuitry of the eighth latch;
a ninth set of cells comprising a first clock path of the shared clock path, the ninth set of cells between the first set of cells and the second set of cells in the first row and between the fifth set of cells and the sixth set of cells in the second row; and
a tenth set of cells comprising a second clock path of the shared clock path, the tenth set of cells between the third set of cells and the fourth set of cells in the first row and between the seventh set of cells and the eighth set of cells in the second row.

8. The multi-bit flip-flop of claim 2, further comprising:
a shared set path to provide a first set signal to the first storage module and the second storage module and second set signal to the first storage module and the second storage module, the first set signal to set the first bit to a first state.

9. The multi-bit flip-flop of claim 2, further comprising:
a shared reset path to provide a first reset signal to the first storage module and the second storage module and second reset signal to the first storage module and the second storage module, the first reset signal to set the first bit to a second state.

10. A multi-bit flip-flop, comprising:
a first set of cells comprising a first storage module configured to store a first bit, the first set of cells comprising a first cell;
a second set of cells comprising a second storage module configured to store a second bit, the second set of cells comprising a second cell;
a third cell comprising a first clock path of a shared clock path, the first clock path configured to provide a first set of clock signals to the first storage module and the second storage module; and
a fourth cell comprising a second clock path of the shared clock path, the second clock path configured to provide a second set of clock signals to the first storage module and the second storage module, the first cell and the second cell located between the third cell and the fourth cell in a layout of the multi-bit flip-flop at an integrated circuit.

11. The multi-bit flip-flop of claim 10, further comprising:
a fifth cell comprising first filter logic configured to identify a first output of the multi-bit flip-flop based on an output of the first storage module, the fifth cell located between the third cell and the fourth cell.

12. The multi-bit flip-flop of claim 11, wherein:
the fifth cell comprises second filter logic configured to identify a second output of the multi-bit flip-flop based on an output of the second storage module.

13. The multi-bit flip-flop of claim 12, wherein:
the fifth cell comprises a first multiplexor configured to select a first input signal for the first storage module.

14. The multi-bit flip-flop of claim 13, wherein:
the fifth cell comprises a second multiplexor configured to select a second input signal for the second storage module.

15. The multi-bit flip-flop of claim 10, wherein:
the third cell further comprises a first set path of a shared set path, the first set path configured to provide a first set signal to the first storage module and the second storage module; and
the fourth cell further comprises a second set path of the shared set path, the second set path configured to provide a second set signal to the first storage module and the second storage module, the first and second set signals to set the first bit and the second bit to a first state.

16. The multi-bit flip-flop of claim 15, wherein:
the third cell further comprises a first reset path of a shared reset path, the first reset path configured to provide a first reset signal to the first storage module and the second storage module; and
the fourth cell further comprises a second reset path of the shared reset path, the second reset path configured to provide a second reset signal to the first storage module and the second storage module, the first and second reset signals to set the first bit and the second bit to a second state.

17. The multi-bit flip-flop of claim 10, wherein:
the first set of cells comprises a fifth cell, the third cell located between the first cell and the fifth cell in the layout.

18. The multi-bit flip-flop of claim 17, wherein:
the second set of cells comprises a sixth cell, the fourth cell located between the second cell and the sixth cell in the layout.

19. A method, comprising:
receiving a first clock signal, via a first clock path of a shared clock path, at a first primary storage module of a first storage stage of a multi-bit flip-flop;
receiving a second clock signal, via a second clock path of the shared clock path, at a first duplicate storage module of the first storage stage;
receiving the first clock signal, via the first clock path, at a second primary storage module of a second storage stage of the multi-bit flip-flop;
receiving a second clock signal, via the second clock path, at a second duplicate storage module of the second storage stage;
identifying a first output of the multi-bit flip-flop based on an output of the first primary storage module and the first duplicate storage module; and
identifying a second output of the multi-bit flip-flop based on an output of the second primary storage module and the second duplicate storage module;
wherein identifying the first output of the multi-bit flip-flop comprises:
in response to a first state of the output of the first primary storage module matching a second state of the output of the first duplicate storage module, setting the first output of the multi-bit flip-flop to the first state; and
in response to a mismatch between the first state and the second state, maintaining the first output of the multi-bit flip-flop at a previously set state.

20. The multi-bit flip-flop of claim 1, wherein:
the first primary storage module comprises a first latch and a second latch;
the first duplicate storage module comprises a third latch and a fourth latch;
the second primary storage module comprises a fifth latch and a sixth latch; and
the second duplicate storage module comprises a seventh latch and an eighth latch.

21. The multi-bit flip-flop of claim 1, wherein the second storage module further comprises second filter logic coupled to a third output of the second primary storage module and to a fourth output of the second duplicate storage module, the second filter logic configured to determine when the third output and the fourth output are the same.

* * * * *